(12) United States Patent
Shelley

(10) Patent No.: US 6,446,216 B1
(45) Date of Patent: Sep. 3, 2002

(54) ELECTRONIC CIRCUITS HAVING HIGH/LOW POWER CONSUMPTION MODES

(75) Inventor: Andrew J. Shelley, Oxen (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/314,660

(22) Filed: May 19, 1999

(30) Foreign Application Priority Data

May 19, 1998 (GB) .............................................. 9810770

(51) Int. Cl.$^7$ .............................................. G06F 1/32
(52) U.S. Cl. .................................... 713/324; 713/501
(58) Field of Search .............................. 713/500, 501, 713/600, 601, 322, 300, 320, 324

(56) References Cited

U.S. PATENT DOCUMENTS 5,600,267 A    2/1997  Wong et al.
5,675,808 A *  10/1997 Gulick et al. ................ 713/322
5,815,693 A *  9/1998  McDermott et al. ........ 713/501
6,266,780 B1 * 7/2001  Grundvig et al. ........... 713/501

* cited by examiner

Primary Examiner—Dennis M. Butler
(74) Attorney, Agent, or Firm—Westman, Champlin & Kelly

(57) ABSTRACT

In order to optimise power consumption, an electronic circuit assembly comprises clock means for switching a plurality of gate circuits, the gate circuits including a first gate circuit having a first power consumption as a function of clock frequency, and a second gate circuit performing a similar function as the first circuit and having a second power requirement as a function of frequency, and means for switching off one gate circuit and switching on the other gate circuit in dependence upon the intended frequency of operation. The circuit assembly may be an arithmetical operation circuit or a finite state machine.

8 Claims, 2 Drawing Sheets

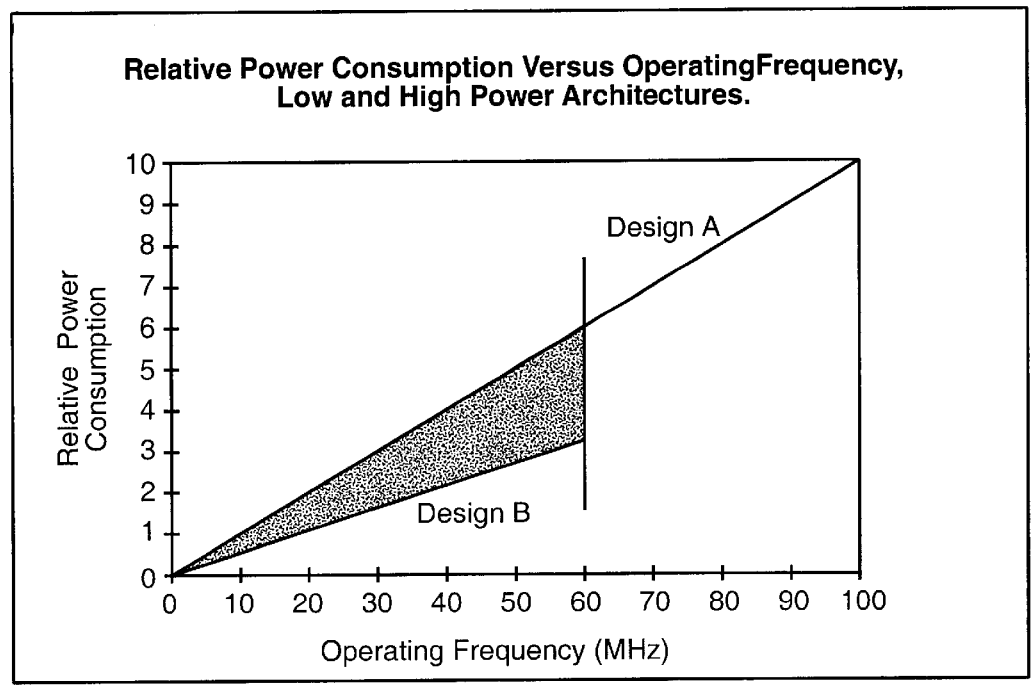
FIG._1
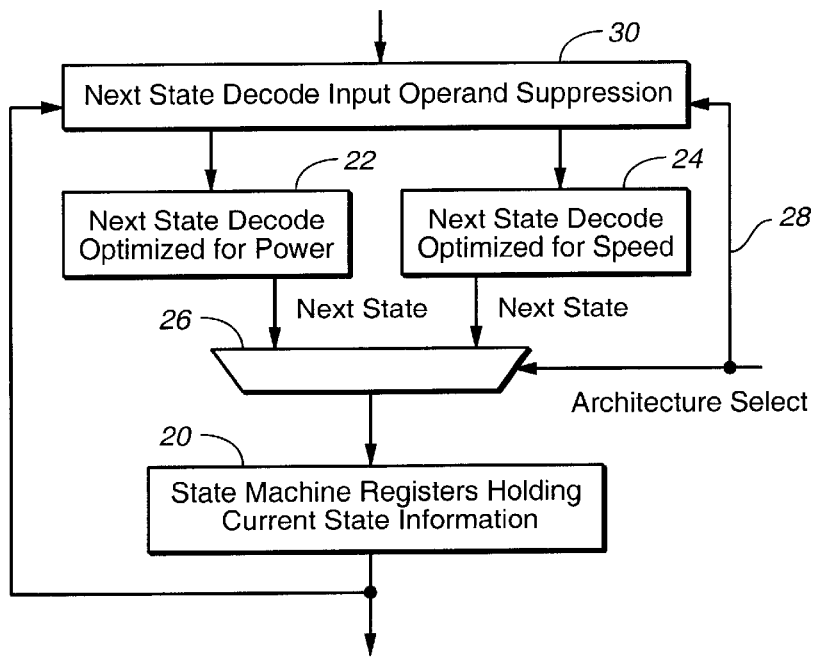
FIG._5

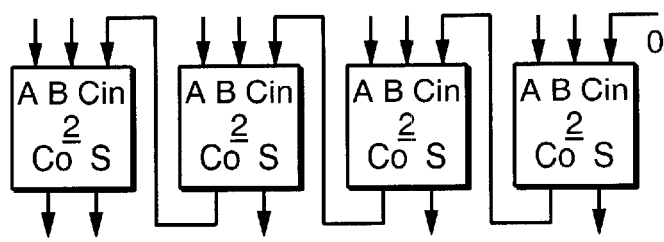
FIG._2
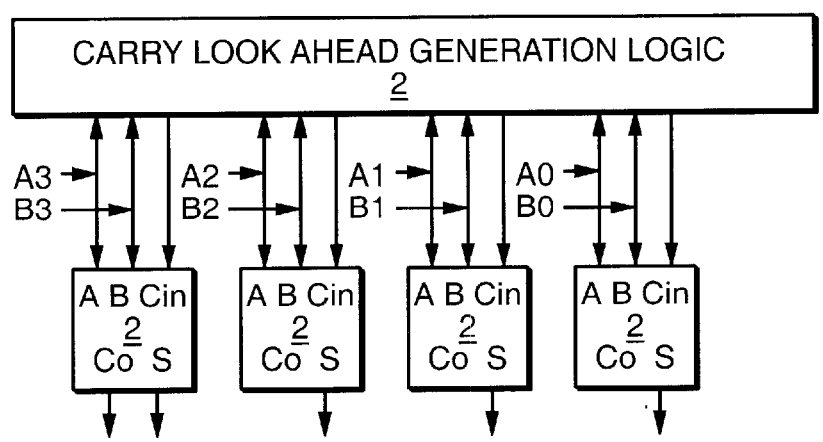
FIG._3
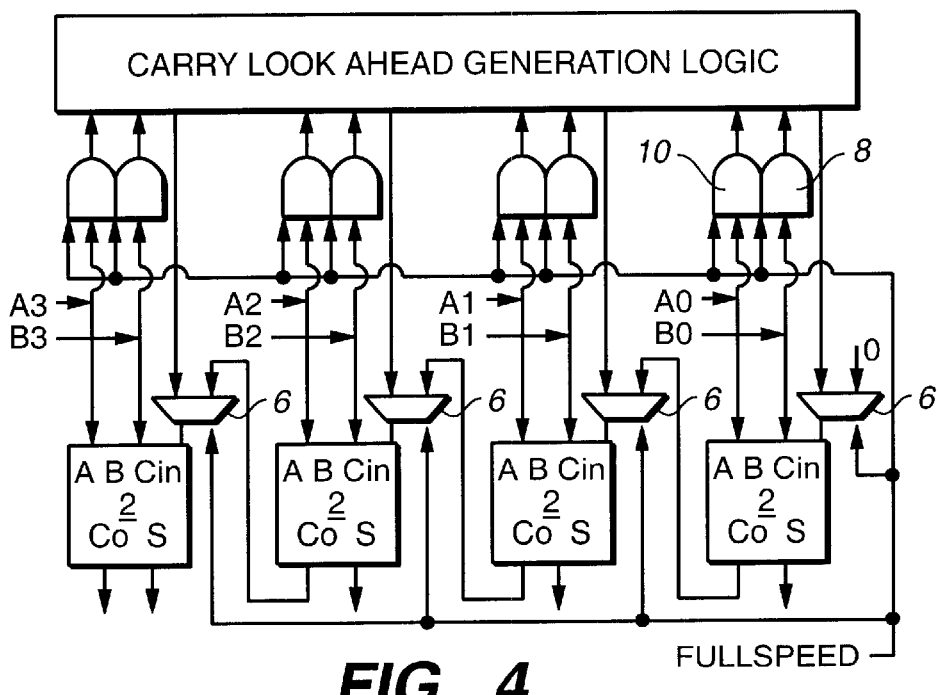
FIG._4

ELECTRONIC CIRCUITS HAVING HIGH/ LOW POWER CONSUMPTION MODES

BACKGROUND OF THE INVENTION

The present invention relates to electronic circuits, and reducing power requirements thereof.

In prior approaches to low power design, power may be minimised via clock manipulation or design for minimal circuit transitions but the fundamental relation of power consumption to frequency is always a continuously increasing function.

Where a circuit is designed with a continuous relationship between power consumption and operating frequency, the architecture must be constructed to meet the upper frequency requirement. Power saving techniques are then applied to the circuit to reduce power consumption across the operating range. Where the circuit is designed to run within a narrow frequency band, this approach gives satisfactory results. However, where a circuit is required to operate over a wide frequency range, e.g. embedded microprocessor core, the architectural strategy applied to meet the demands of high frequency operation restrict the power efficiency of the design at low frequency.

Consider the relationship shown in FIG. 1 between power and frequency for an electronic circuit. For the purpose of this explanation the static power consumption of the circuit is assumed to be negligible with all power consumed by transitioning signal edges. The graph (FIG. 1) shows the power consumption versus frequency relationship for a circuit implemented using two differing architectures. Design A is a high performance approach capable of running at up to 100 MHz and its power consumption rises linearly from zero at DC (0 MHz) up to 10 relative units at 100 MHz. The power consumption can be described as 0.1 units/MHz. Design B has been designed for low power operation and has a lower upper frequency limit of 60 MHz. Its power consumption versus frequency also starts at zero for DC and rises linearly up to its maximum frequency of 60 MHz (0.05 units/MHz).

SUMMARY OF THE INVENTION

The present invention provides an electronic circuit assembly comprising clock means for switching a plurality of gate circuits, the gate circuits including a first gate circuit having a first power consumption as a function of clock frequency, and a second gate circuit performing a similar function as the first circuit and having a second power requirement as a function of frequency, and means for switching off one gate circuit and switching on the other gate circuit in dependence upon the intended frequency of operation.

Commonly, the circuit assembly according to the invention comprises a circuit for performing mathematical operations, in particular adder circuits, substractor circuits and multiplier circuits. It is in this type of circuit where power requirements may become excessive when operated at high frequency. Another example is a finite state machine for regulating the sequential operation of an application.

In a preferred embodiment, the first gate circuit is a ripple adder circuit which has a relatively low power consumption but is relatively slow in operation, and the second gate circuit comprises a carry look ahead adder circuit. The upper frequency limit of such carry look ahead generation circuit is higher than that of a ripple adder, but it also requires a significantly greater power consumption in view of the greater amount of logic circuits therein.

The means for switching between the gate circuits may preferably comprise a presettable switch which is preset according to the intended frequency of operation. This gives a circuit designer freedom in selecting an appropriate power consumption for the intended application. Alternatively, an adaptive switch may be employed responsive to the actual clock frequency used for switching between the gate circuits at an appropriate frequency.

BRIEF DESCRIPTION OF THE DRAWINGS

FIG. 1 is a graphical view of power requirements as a function of gating frequency of two electrical circuits;

FIG. 2 is a block diagram of a ripple adder circuit;

FIG. 3 is a block diagram of a carry look ahead adder circuit; and

FIG. 4 is a block diagram of a first embodiment of the present invention, incorporated the circuits of FIGS. 1 and 2.

FIG. 5 is a block diagram of a finite state machine embodiment of the invention.

DETAILED DESCRIPTION OF ILLUSTRATIVE EMBODIMENTS

Referring now to FIG. 2, a ripple adder is constructed from an array of full adder gate circuit components 2, one for each bit of the adder. Each full adder combines a single bit of the input data words (A and B) with a carry in signal (Cin) generated by the adjacent stage to produce one bit of the result (S) and a carry out signal (Co). The operation is low power as there are relatively few gates to propagate signal transitions but the performance is slow since the sum output of the leftmost (most significant bit) full adder is dependent on all the other full adders in the chain and incurs the sum of their signal propagation delays.

An alternative to the ripple architecture is the carry look ahead adder (CLA) shown in FIG. 3.

Instead of rippling the carry logic through each of the adder stages, each carry input to the full adders is independently generated from the A and B data words in carry look ahead generation logic 4. This requires fewer gate stages to compute carry in signals for each bit when compared to their generation via rippling. Consequently, the upper frequency limit is higher than that of the ripple component. The volume of logic required to implement this if far greater than the ripple adder and the corresponding power consumption is greater.

Referring to FIG. 4, by combining the architecture of FIGS. 2 and 3, an adder is created capable of either low power ripple based or high frequency CLA based operation. The extension of the CLA to include ripple capability has a small impact on both the area and the critical path (area impact increased linearly with adder bitwidth and critical path overhead is constant irrespective of bit width). The additional logic is a single multiplex stage 6 and two "AND" gates 8, 10 per adder bit. The "FULLSPEED" signal is used to select the mode of operation. During ripple operation CLA logic inputs are pulled low and no power is dissipated in this circuit giving slower but lower power operation. When high performance is required a "FULLSPEED" control time is enabled to switch multiplexers 6 and enable gates 8,10. The carry look ahead logic is enabled and the carry inputs to the full adder components are driven from the carry look ahead logic outputs, giving earlier presentation of the carry signals and hence faster operation.

Thus referring back to FIG. 1, if the Design B line represents the ripple adder circuit and Design A line represents the carry look ahead circuit, switching may occur at a frequency of 60 MHz. The shaded area represents the potential power savings of the invention. The present invention facilitates the creation of circuits which exhibit the power characteristics of circuits designed for low frequency operation whilst retaining high frequency performance within the same silicon design.

As a further example of the application of a finite discontinuity in the power consumption of an electronic circuit reference is made to FIG. 5, showing the construction of a digital finite state machine exhibiting non-linear power/frequency power characteristics via a dual architecture next state decode with a selection mechanism. This can be separated into two distinct design blocks, registers 20 used to hold the current state information and the combinatorial logic 22, 24 used to decode the next state information. The combinatorial logic is optimised during synthesis according to whether the designer requires a fast, therefore large and power hungry circuit 22 or a smaller, slower and hence lower power circuit 24. The dual architecture state machine contains a single registering circuit 20 but dual implementations of the next state combinatorial decode logic 22, 24. The two dual implementations can be separately optimised, one for low power and the other for high speed without comprising the circuit functionality. A multiplexing function 26 is added to select which mode of operation is to be utilised. A select line 20 for this function is shown as Architecture Select. The multiplexor 26 selects which next state decode information is loaded into the registers. The Architecture Select control is also used in the next state decode input operand suppression unit 30 where the state machine inputs and current state feedback are isolated from the next state decoder not in use to achieve the desired low power operation.

Although the present invention has been described with reference to preferred embodiments, workers skilled in the art will recognize that changes may be made in form and detail without departing from the spirit and scope of the invention.

What is claimed is:

1. An electronic circuit assembly comprising clock means for switching a plurality of gate circuits, the gate circuits including a first gate circuit having a first power consumption as a function off clock frequency, and a second gate circuit performing a similar function at the first circuit and having a second power requirement as a function of frequency, and means for switching off one gate circuit and switching on the other gate circuit in dependence upon the intended frequency of operation, wherein only one of the first or second gates is operating to provide the function at a time.

2. A circuit assembly according to claim 1, wherein the circuit assembly is arranged for carrying out arithmetic operations.

3. A circuit assembly according to claim 2, wherein the first gate circuit comprises a ripple adder circuit, and the second gate circuit comprises a carry look ahead adder circuit.

4. A circuit assembly according to claim 3, wherein the ripple adder gate circuit comprises a plurality of bit units for receiving the respective bits of input data words together with a carry in signal, and the carry out output signal of each bit unit being connected to the carry in input of the next higher bit unit.

5. A circuit assembly according to claim 4, wherein the carry look ahead adder circuit comprises a plurality of bit units, with the data inputs and the carry in input of each bit unit being coupled to carry look ahead generation logic.

6. A circuit assembly according to claim 5, wherein the bit units of the ripple adder circuit constitute the bit circuits of the carry look ahead circuit, and including gate means coupling the data inputs of each bit unit to said carry look ahead generation logic, and including multiplexer means coupling each carry in input to said carry look ahead generation logic and the carry out output of the next lower bit unit, and including control means for switching said gate means and multiplexer means to enable operation of the circuit either as a ripple adder or as a carry look ahead adder circuit.

7. A circuit assembly according to claim 1, wherein the switch means is presettable for selecting either the first or second gate circuit.

8. A circuit assembly according to claim 1, comprising a finite state machine wherein said first gate circuit comprises logic for decoding next state information and said second gate circuit comprises logic for decoding next state information, and multiplexor means for selecting the output either of the first or second gate circuit in dependence on a control input, and for applying the selected output to a set of state machine registers holding current state information.

* * * * *